United States Patent
Tjandra et al.

(10) Patent No.: US 9,514,968 B2
(45) Date of Patent: Dec. 6, 2016

(54) METHODS AND APPARATUS FOR SELECTIVE OXIDATION OF A SUBSTRATE

(71) Applicant: APPLIED MATERIALS, INC., Santa Clara, CA (US)

(72) Inventors: Agus Tjandra, San Jose, CA (US); Christopher S. Olsen, Fremont, CA (US); Johanes Swenberg, Los Gatos, CA (US); Lara Hawrylchak, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/673,320

(22) Filed: Mar. 30, 2015

(65) Prior Publication Data

US 2015/0206777 A1 Jul. 23, 2015

Related U.S. Application Data

(62) Division of application No. 13/764,137, filed on Feb. 11, 2013, now Pat. No. 8,993,458.

(Continued)

(51) Int. Cl.
*H01L 21/00* (2006.01)
*C23C 16/00* (2006.01)
(Continued)

(52) U.S. Cl.
CPC ... *H01L 21/67098* (2013.01); *H01L 21/02238* (2013.01); *H01L 21/02244* (2013.01);
(Continued)

(58) Field of Classification Search
CPC .................... H01L 21/67098; H01L 21/67115; H01L 21/67248; H01L 21/02244; H01L 21/67109; H01L 21/02238
See application file for complete search history.

(56) References Cited

U.S. PATENT DOCUMENTS 5,260,600 A   11/1993   Harada
5,330,935 A   7/1994   Dobuzinsky et al.
(Continued)

FOREIGN PATENT DOCUMENTS

| EP | 0 837 155 A1 | 4/1998 |
|---|---|---|
| JP | 5343391 | 12/1993 |
| WO | WO 2006016642 A1 | 2/2006 |

OTHER PUBLICATIONS

Quirk, et al., Semiconductor Manufacturing Technology, 2001, Prentice Hall, p. 231.
(Continued)

*Primary Examiner* — Richard Booth
(74) *Attorney, Agent, or Firm* — Moser Taboada; Alan Taboada

(57) ABSTRACT

Methods and apparatus for improving selective oxidation against metals in a process chamber are provided herein. In some embodiments, a method of oxidizing a first surface of a substrate disposed in a process chamber having a processing volume defined by one or more chamber walls may include exposing the substrate to an oxidizing gas to oxidize the first surface; and actively heating at least one of the one or more chamber walls to increase a temperature of the one or more chamber walls to a first temperature of at least the dew point of water while exposing the substrate to the oxidizing gas.

11 Claims, 3 Drawing Sheets

Related U.S. Application Data

(60) Provisional application No. 61/597,900, filed on Feb. 13, 2012.

(51) Int. Cl.
 *H01L 21/67* (2006.01)
 *H01L 21/02* (2006.01)

(52) U.S. Cl.
 CPC .. *H01L 21/67109* (2013.01); *H01L 21/67115* (2013.01); *H01L 21/67248* (2013.01)

(56) References Cited

U.S. PATENT DOCUMENTS

| | | | |
|---|---|---|---|
| 5,412,246 A | 5/1995 | Dobuzinsky et al. | |
| 5,800,621 A | 9/1998 | Redeker et al. | |
| 6,114,258 A | 9/2000 | Miner et al. | |
| 6,159,835 A | 12/2000 | Visokay et al. | |
| 6,303,440 B1 | 10/2001 | Araki et al. | |
| 6,348,420 B1 | 2/2002 | Raaijmakers et al. | |
| 6,450,116 B1 | 9/2002 | Noble et al. | |
| 6,458,714 B1 | 10/2002 | Powell et al. | |
| 6,534,421 B2 | 3/2003 | Kakkad | |
| 6,544,900 B2 | 4/2003 | Raaijmakers et al. | |
| 6,598,559 B1 | 7/2003 | Vellore et al. | |
| 6,638,876 B2 | 10/2003 | Levy et al. | |
| 6,716,734 B2 | 4/2004 | Seitz et al. | |
| 6,753,506 B2 | 6/2004 | Liu et al. | |
| 6,770,332 B2 | 8/2004 | Nakase et al. | |
| 6,803,275 B1 | 10/2004 | Park et al. | |
| 6,929,700 B2 | 8/2005 | Tan et al. | |
| 6,958,112 B2 | 10/2005 | Karim et al. | |
| 7,029,999 B2 | 4/2006 | Lim et al. | |
| 7,030,475 B2 | 4/2006 | Kim | |
| 7,122,477 B2 | 10/2006 | Ikeda | |
| 7,141,514 B2 | 11/2006 | Chua | |
| 7,179,754 B2 | 2/2007 | Kraus et al. | |
| 7,189,652 B1 | 3/2007 | Blosse et al. | |
| 7,214,628 B2 | 5/2007 | Chua | |
| 7,226,874 B2 | 6/2007 | Matsuyama et al. | |
| 7,229,931 B2 | 6/2007 | Mungekar et al. | |
| 7,407,871 B2 | 8/2008 | Kumar et al. | |
| 7,497,959 B2 | 3/2009 | Kim et al. | |
| 7,521,316 B2 | 4/2009 | Sohn et al. | |
| 7,534,709 B2 | 5/2009 | Park et al. | |
| 7,629,033 B2 | 12/2009 | Hongo et al. | |
| 7,645,709 B2 | 1/2010 | Chua et al. | |
| 7,687,389 B2 | 3/2010 | Lim et al. | |
| 7,727,828 B2 | 6/2010 | Chua et al. | |
| 7,947,561 B2 | 5/2011 | Mani et al. | |
| 7,951,728 B2 | 5/2011 | Yokota et al. | |
| 8,207,044 B2 | 6/2012 | Mani et al. | |
| 2002/0052124 A1 | 5/2002 | Raaijmakers et al. | |
| 2002/0173126 A1 | 11/2002 | Nickles et al. | |
| 2002/0177276 A1 | 11/2002 | Su | |
| 2003/0176062 A1 | 9/2003 | Doan et al. | |
| 2003/0232507 A1 | 12/2003 | Chen | |
| 2004/0077142 A1 | 4/2004 | Chao et al. | |
| 2004/0106296 A1 | 6/2004 | Hu et al. | |
| 2004/0227179 A1 | 11/2004 | Rabkin et al. | |
| 2005/0019992 A1 | 1/2005 | Hong et al. | |
| 2005/0095783 A1 | 5/2005 | Haselden et al. | |
| 2005/0101147 A1 | 5/2005 | Labelle et al. | |
| 2005/0124109 A1 | 6/2005 | Quevedo-Lopez et al. | |
| 2005/0127133 A1 | 6/2005 | Selvamanickam | |
| 2006/0051921 A1 | 3/2006 | Youn et al. | |
| 2006/0105114 A1 | 5/2006 | White | |
| 2006/0105516 A1 | 5/2006 | Belyansky et al. | |
| 2006/0172551 A1 | 8/2006 | Chua | |
| 2006/0223315 A1 | 10/2006 | Yokota et al. | |
| 2006/0292784 A1 | 12/2006 | Sohn et al. | |
| 2007/0026693 A1 | 2/2007 | Yokota et al. | |
| 2007/0063251 A1 | 3/2007 | Tu et al. | |
| 2007/0066013 A1 | 3/2007 | Lim et al. | |
| 2007/0093012 A1 | 4/2007 | Chua et al. | |
| 2007/0128880 A1 | 6/2007 | Kitagawa et al. | |
| 2007/0224836 A1 | 9/2007 | Sasaki et al. | |
| 2007/0298568 A1 | 12/2007 | Mokhlesi | |
| 2008/0011426 A1 | 1/2008 | Chua | |
| 2008/0032511 A1 | 2/2008 | Kabe et al. | |
| 2008/0090354 A1 | 4/2008 | Baek et al. | |
| 2008/0135954 A1 | 6/2008 | Ohmi et al. | |
| 2008/0138994 A1 | 6/2008 | Ueda et al. | |
| 2009/0035952 A1 | 2/2009 | Chua et al. | |
| 2009/0047778 A1 | 2/2009 | Sasaki | |
| 2009/0152629 A1 | 6/2009 | Hu et al. | |
| 2009/0163042 A1 | 6/2009 | Tseng et al. | |
| 2009/0169768 A1 | 7/2009 | Ueda et al. | |
| 2009/0233453 A1 | 9/2009 | Mani et al. | |
| 2009/0253244 A1 | 10/2009 | Lee et al. | |
| 2009/0269939 A1 | 10/2009 | Sprey | |
| 2009/0311877 A1 | 12/2009 | Olsen et al. | |
| 2010/0151694 A1 | 6/2010 | Peuse et al. | |
| 2010/0297854 A1 | 11/2010 | Ramamurthy et al. | |
| 2011/0061812 A1 | 3/2011 | Ganguly et al. | |
| 2011/0281440 A1 | 11/2011 | Porshnev | |

OTHER PUBLICATIONS

Lim, Kwan-Yong et al., "Highly Reliable and Scalable Tungsten Polymetal Gate Process for Memory Devices Using Low-Temperature Plasma Selective Gate Reoxidation", 2006 Symposium on VLSI Technology Digest of Technical Papers, Jun. 2006.

International Search Report and Written Opinion mailed Jul. 31, 2009 for PCT Application No. PCT/US2009/036808.

International Search Report and Written Opinion mailed Dec. 30, 2009 for PCT Application No. PCT/US2009/047035.

International Search Report and Written Opinion mailed Aug. 29, 2011 for PCT Application No. PCT/US2011/023229.

International Search Report and Written Opinion mailed Jun. 2, 2013 for PCT Application No. PCT/US2013/025577.

Search Report received from The State Intellectual Property Office of The People's Republic of China dated Mar. 4, 2016 for China Application No. 2013800088232.

METHODS AND APPARATUS FOR SELECTIVE OXIDATION OF A SUBSTRATE

CROSS-REFERENCE TO RELATED APPLICATIONS

This application is a divisional of co-pending U.S. patent application Ser. No. 13/764,137, filed Feb. 11, 2013, which claims benefit of U.S. provisional patent application Ser. No. 61/597,900, filed Feb. 13, 2012. Each of the aforementioned related patent applications is herein incorporated by reference.

FIELD

Embodiments of the present invention generally relate to substrate processing.

BACKGROUND

In the manufacture of semiconductor devices, selective oxidation is used to target certain materials, such as silicon and oxides of silicon, while avoiding oxidation of other materials such as metals. Rapid thermal processing (RTP) is also used in the manufacture of semiconductor devices to change the characteristics of a deposited film or crystal lattice and generally includes processes such as annealing, silicidation, and oxidation of a substrate surface. The inventors have discovered that selective oxidation processes against metals in an RTP process using hydrogen and oxygen can undesirably result in the formation of moisture or condensation within the RTP chamber. The inventors have further observed that such moisture can act to transport contaminant particles onto the semiconductor wafer within the process chamber and further may result in undesirable oxidation of the metals on the substrate.

Accordingly, the inventors have provided improved methods and apparatus for selective oxidation against metals.

SUMMARY

Methods and apparatus for improving selective oxidation against metals in a process chamber are provided herein. In some embodiments, a method of oxidizing a first surface of a substrate disposed in a process chamber having a processing volume defined by one or more chamber walls may include exposing the substrate to an oxidizing gas to oxidize the first surface; and actively heating at least one of the one or more chamber walls to increase a temperature of the one or more chamber walls to a first temperature of at least the dew point of water while exposing the substrate to the oxidizing gas.

In some embodiments, a method of oxidizing a first surface of a substrate disposed in a process chamber having a processing volume defined by one or more chamber walls may include exposing the one or more chamber walls to a first gas comprising at least one of hydrogen ($H_2$), nitrogen ($N_2$), or an inert gas while raising the temperature of the one or more chamber walls to a first temperature greater than the dew point of water; exposing the substrate to an oxidizing gas to selectively oxidize the first surface for a first period of time beginning when or after the one or more chamber walls reaches the first temperature, wherein the one or more chamber walls increases in temperature from the first temperature to a second temperature during the first period of time and wherein the one or more chamber walls remains above the first temperature for the remainder of the first period of time; ceasing flow of the oxidizing gas after the first period of time; and subsequently exposing the one or more chamber walls to a second gas comprising nitrogen ($N_2$) while raising the temperature of the one or more chamber walls to a third temperature greater than the second temperature.

In some embodiments, an apparatus for thermally processing a substrate may include a chamber having sidewalls defining a processing volume and having a substrate support disposed within the processing volume; a first heat source comprising a plurality of lamps disposed opposite the substrate support to provide thermal energy to a substrate when disposed on the substrate support, wherein the energy density of the plurality of lamps is about 30 watts per square centimeter to about 80 watts per square centimeter; and a second heat source coupled to the sidewalls to provide thermal energy to the sidewalls.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
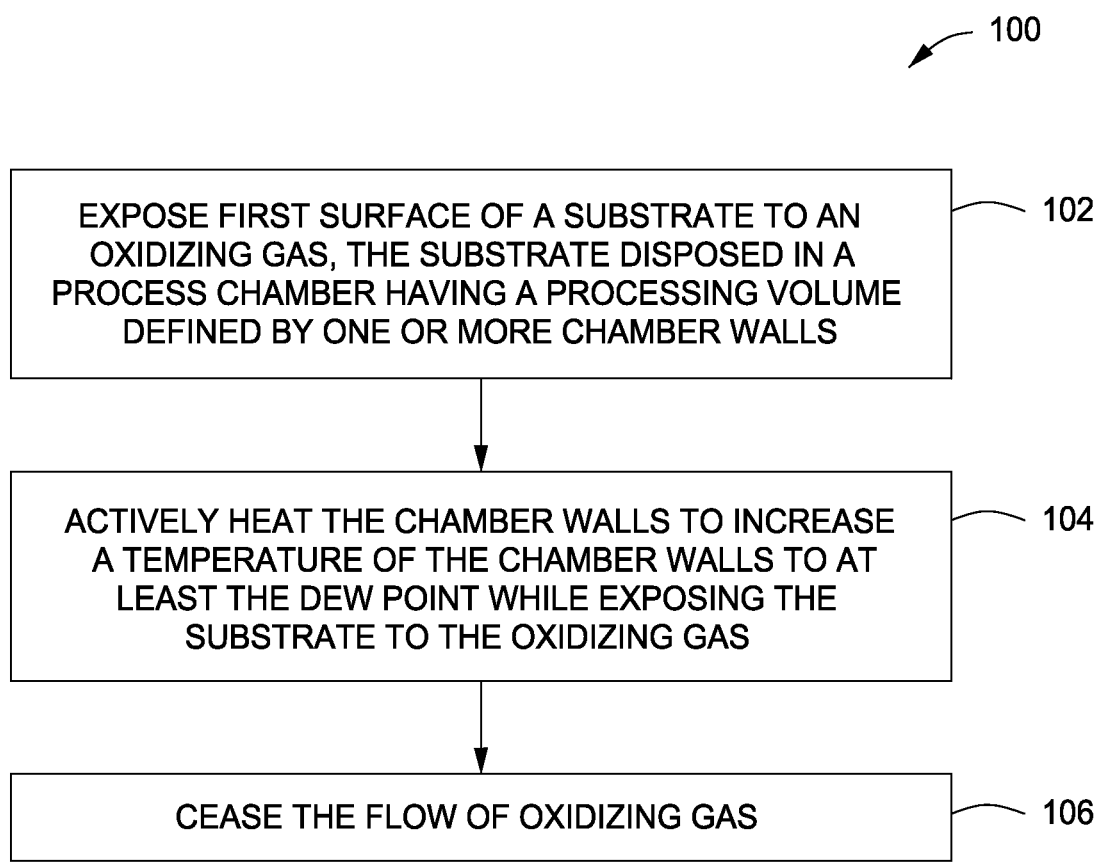
FIG. 1 depicts a flow chart of a method for oxidizing a substrate in a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for improving selective oxidation against metals in a process chamber are provided herein. FIG. 1 depicts a flowchart of a method 100 of selectively oxidizing a first surface of a substrate disposed in a process chamber having a processing volume defined by one or more chamber walls in accordance with some embodiments of the present invention. Although described herein in connection with selective oxidation processes, the inventive methods and apparatus may be useful in non-selective oxidation processes or other processes where the suppression of moisture within the process chamber may be desired.

Selective oxidation (e.g., oxidation of portions of a structure or device on a substrate) requirements may arise when oxidation processes need to be carried out in the presence of exposed metal or metal alloys. In such cases, the oxidation process needs to be carried out without abnormal oxidation of the exposed metal/metal alloy. The need for selective oxidation in the case of Logic, DRAM, Flash devices, or the like, typically arises during gate sidewall re-oxidation processes after a gate stack etch when metal gate electrodes are present, such as gate electrodes comprising titanium (Ti), titanium nitride (TiN), tungsten (W), tungsten silicide nitride (WSixN), tungsten nitride (WN), tantalum carbide (TaC), tantalum nitride (TaN), or the like. The methods and apparatus described herein may also be used, however, in other processes where selective oxidation is desired.

The process chamber may be any type of process chamber configured to perform a selective oxidation process, as modified by the teachings provided herein. Examples of process chambers suitable for modification include any of the RADIANCE®, RADIANCE® PLUS, or VANTAGE® process chambers, or any other process chamber capable of performing a thermal process, for example a rapid thermal process (RTP), all available from Applied Materials, Inc., of Santa Clara, Calif. Other suitable process chambers, including those available from other manufacturers may also be modified and used in accordance with the teachings provided herein. In some embodiments, the process chamber may be similar to the process chamber described below with respect to FIG. 3.

The method 100 generally begins at 102, by exposing a first surface of a substrate to an oxidizing gas to oxidize the first surface of the substrate. The first surface is a non-metal containing layer atop a substrate which may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like. In some embodiments, the oxidation process may be a selective oxidation process, wherein the substrate further comprises an exposed metal surface. For example, in some embodiments, the first surface of the substrate may be non-metallic and the substrate may further comprise an exposed second surface that is metallic, and the first and second surfaces may be exposed to the oxidizing gas to oxidize the first surface, while substantially not oxidizing the exposed second surface.

In some embodiments, the oxidation process may utilize an oxidizing gas comprising oxygen ($O_2$), nitrous oxide ($N_2O$), nitric oxide (NO), or combinations thereof. In some embodiments, the oxidizing gas may further include an additional gas comprising hydrogen ($H_2$). In some embodiments, the oxidizing gas may further include a first gas comprising hydrogen ($H_2$) and at least one of nitrogen ($N_2$), ammonia ($NH_3$), or an inert gas. In some embodiments, the oxidizing gas comprises oxygen ($O_2$) and hydrogen ($H_2$). In some embodiments, the oxidizing gas may comprise at least 85% hydrogen ($H_2$) with the balance being predominantly, or substantially only, oxygen ($O_2$). The oxidizing gas may be flowed at any suitable flow rate depending upon, for example, one or more of the substrate/chamber size, the materials of the substrate, the oxidizing gas composition, or the like. In some embodiments, the oxidizing gas may be provided at a total flow rate in the range of about 10,000 to about 20,000 sccm. In some embodiments, the oxidizing gas is provided while maintaining the process chamber at a pressure of about 450 to about 530 Torr, although higher and lower pressures may be provided.

The inventors have discovered that oxidation processes using hydrogen and oxygen may undesirably produce moisture within the process chamber. The moisture may undesirably transport contaminant particles onto the surface of the substrate and may also undesirably oxidize metal components of the substrate. Without wishing to be bound by theory, the inventors believe that this problem may be a result of a temperature of the walls of the chamber being below the dew point for water in the processing volume of the process chamber. The inventors have observed that even though the chamber walls in conventional oxidation chambers may be passively heated during the oxidation process, the chamber walls do not get heated to a sufficient temperature or do not heat up at a sufficiently rapid rate sufficient to eliminate or reduce moisture formation within the process chamber. For example, in a process chamber having a lamp assembly positioned above the substrate to supply heat to the substrate, it may also indirectly heat the chamber walls, and/or heat radiating from the substrate may heat the chamber walls. However, the inventors have observed that this indirect, or passive, heating does not adequately increase the temperature of the chamber walls to a level that would inhibit moisture formation within the process chamber.

The inventors have discovered that actively heating the chamber walls to a temperature at least equal to the dew point of water, moisture formation within the process chamber may be advantageously inhibited. Moreover, the inventors have discovered that minimizing the formation of moisture within the process chamber further advantageously reduces contaminant particles on the substrate, including undesired oxidation of metal on the substrate. Therefore, at 104, at least one of the chamber walls are actively heated to increase the temperature of the chamber walls to at least the dew point of water while exposing the substrate to the oxidizing gas.

As used herein, active heating, or actively heating, means the direct application of heat or energy to raise the temperature of the walls of the process chamber via a heating apparatus disposed within or coupled to the chamber walls, such as a heat exchanger or a heat jacket, which surrounds and heats the chamber walls, for example using a heat transfer medium, resistive heaters, radiative heat lamps, or the like. Actively heating the chamber walls advantageously facilitates raising the temperature of the chamber walls to the dew point faster than through the indirect heating described above. Active heating of the chamber walls may also provide a more repeatable chamber wall temperature before the process step, as compared to relying upon passive methods to heat the walls, because the active heating of the chamber walls can be well-controlled. For example, in some embodiments, a sensor (e.g., 312) such as a thermocouple or other suitable sensor may be provided to indicate the temperature of the chamber wall. The sensor may provide data corresponding directly to the temperature of inner surfaces of the chamber wall, or the sensor may provide data corresponding to the temperature of an outer surface of the chamber wall, from which the inner chamber wall temperature may be determined. The temperature data from the sensor may be provided to a controller (e.g., 302) to facilitate control over the active heating of the chamber walls (e.g., configured in a feedback loop).

The flow of the oxidizing gas may continue for a desired period of time until the process is completed. Upon completion of the oxidation process, the flow of the oxidizing gas to the substrate is ceased, as depicted at 106, and the substrate may be further processed as desired.

Optionally, in some embodiments, the process chamber may be exposed to a first gas comprising at least one of hydrogen, nitrogen, or an inert gas, such as argon, prior to exposing the substrate to the oxidizing gas. In some embodiments, the first gas is hydrogen ($H_2$). For example, in some embodiments, the oxidation gas may be a mixture of oxygen ($O_2$) and hydrogen ($H_2$) and the hydrogen ($H_2$) may be provided initially as the first gas, with the oxygen ($O_2$) subsequently being introduced to start the flow of the oxidation gas mixture.

In some embodiments, the first gas is introduced to the process chamber while heating the substrate, for example by irradiating the substrate with energy from heating lamps. In some embodiments, the energy provided to the substrate is about equal to the energy provided during the oxidation process. In some embodiments, the energy provided to the substrate is sufficient for a pyrometer (e.g., 318) aimed at a backside of the substrate to read a temperature of about 700 to about 1000 degrees Celsius. Providing the first gas while providing heat energy may facilitate more rapidly raising the temperature of the chamber walls to a first temperature of about 5 to about 10 degrees Celsius above the dew point temperature. The inventors have observed that providing the first gas while providing heat energy further advantageously facilitates heating portions of the chamber that are typically protected from passive heating, such as slit valve openings or other components that may be shielded or more remotely disposed with respect to the process heat source and/or the substrate, thereby further reducing moisture formation on such components. In some embodiments, the chamber walls may simultaneously be actively heated while the first gas is provided. In some embodiments, the process chamber is exposed to the first gas for about 15 seconds while the substrate is heated, although other periods of time may be used. In some embodiments, the first gas is provided at a flow rate range of about 10 to about 20 slm. The inventors have discovered that providing the first gas while providing heat energy in combination with actively heating the chamber walls further advantageously improves the selectivity of the oxidation process against metal.

Figure 2:
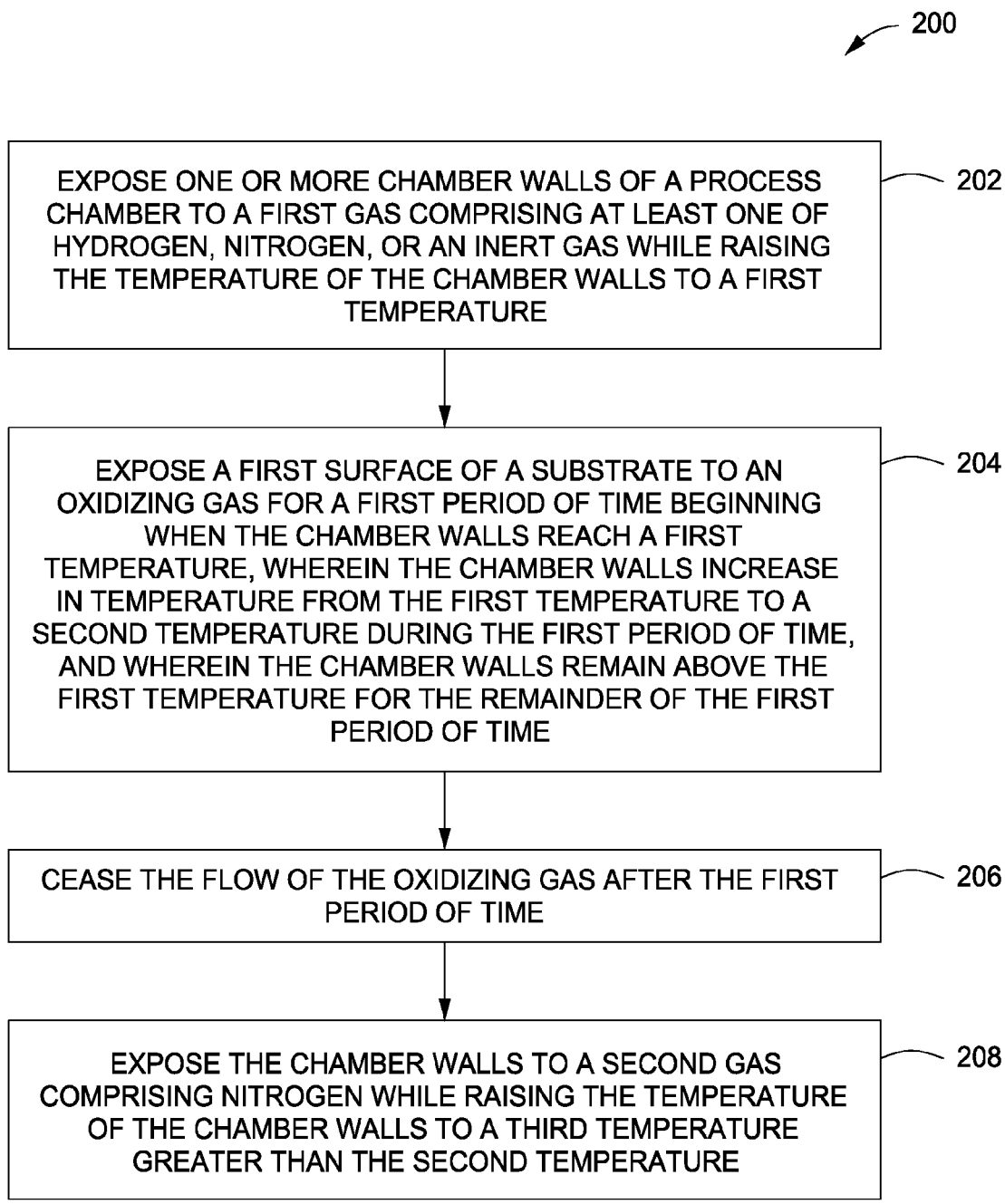
FIG. 2 depicts a flow chart of a method for oxidizing a substrate in a process chamber in accordance with some embodiments of the present invention.

Other variations of the inventive methods may also be used. For example, FIG. 2 depicts a flowchart of a method 200 of selectively oxidizing a first surface of a substrate disposed in a process chamber having a processing volume defined by one or more chamber walls in accordance with some embodiments of the present invention. Details regarding the first surface of the substrate, the substrate and the process chamber have been provided above with respect to FIG. 1.

The method 200 begins at 202, by exposing the chamber walls of a process chamber to a first gas comprising at least one of hydrogen, nitrogen, or an inert gas, such as argon. The first gas is introduced to the process chamber while heating the substrate such that a pyrometer aimed at a backside of the substrate will read a temperature of about 700 to about 1000 degrees Celsius. Providing the first gas while heating the substrate may be performed for a sufficient time period in order to raise the temperature of the chamber walls to a first temperature of about 5 to about 10 degrees Celsius above the dew point temperature.

Next, at 204, the substrate is exposed to an oxidizing gas to selectively oxidize the first surface of the substrate for a first period of time. The oxidizing gas may be any oxidizing gas as discussed above with respect to FIG. 1. The first period of time begins when the chamber walls reach the first temperature. During the first period of time, the chamber walls increase from the first temperature to a second temperature. The temperature of the chamber walls remains above the first temperature during the remainder of the first period of time. The first period of time ends once the selective oxidation process is completed.

Next, at 206, the flow of oxidizing gas to the process chamber is ceased after the first period of time and, at 208, the chamber walls may be subsequently exposed to a second gas comprising one or more of nitrogen ($N_2$), an inert gas, or hydrogen ($H_2$). In some embodiments, the second gas is nitrogen ($N_2$). The second gas is introduced while raising the temperature of the chamber walls to a third temperature, greater than the second temperature. For example, the temperature of the chamber walls may be raised by providing heat to the processing volume of the process chamber, for example, using lamps directed toward the substrate. The lamps may be the lamps used to provide heat to the substrate during the oxidation process and may be sufficient, for example, to heat the substrate to so that a pyrometer aimed at a backside of the substrate reads a temperature of about 700 to about 1000 degrees Celsius. The inventors have discovered that providing the above-described post-oxidation exposure to the second gas and continuing to heat the chamber walls further reduces moisture formation on the chamber walls and further reduces particles on the substrate. In addition, the inventors have discovered that providing the above-described post-oxidation exposure to the second gas and continuing to heat the chamber walls further improves the selectivity of the oxidation process against metals.

Figure 3:
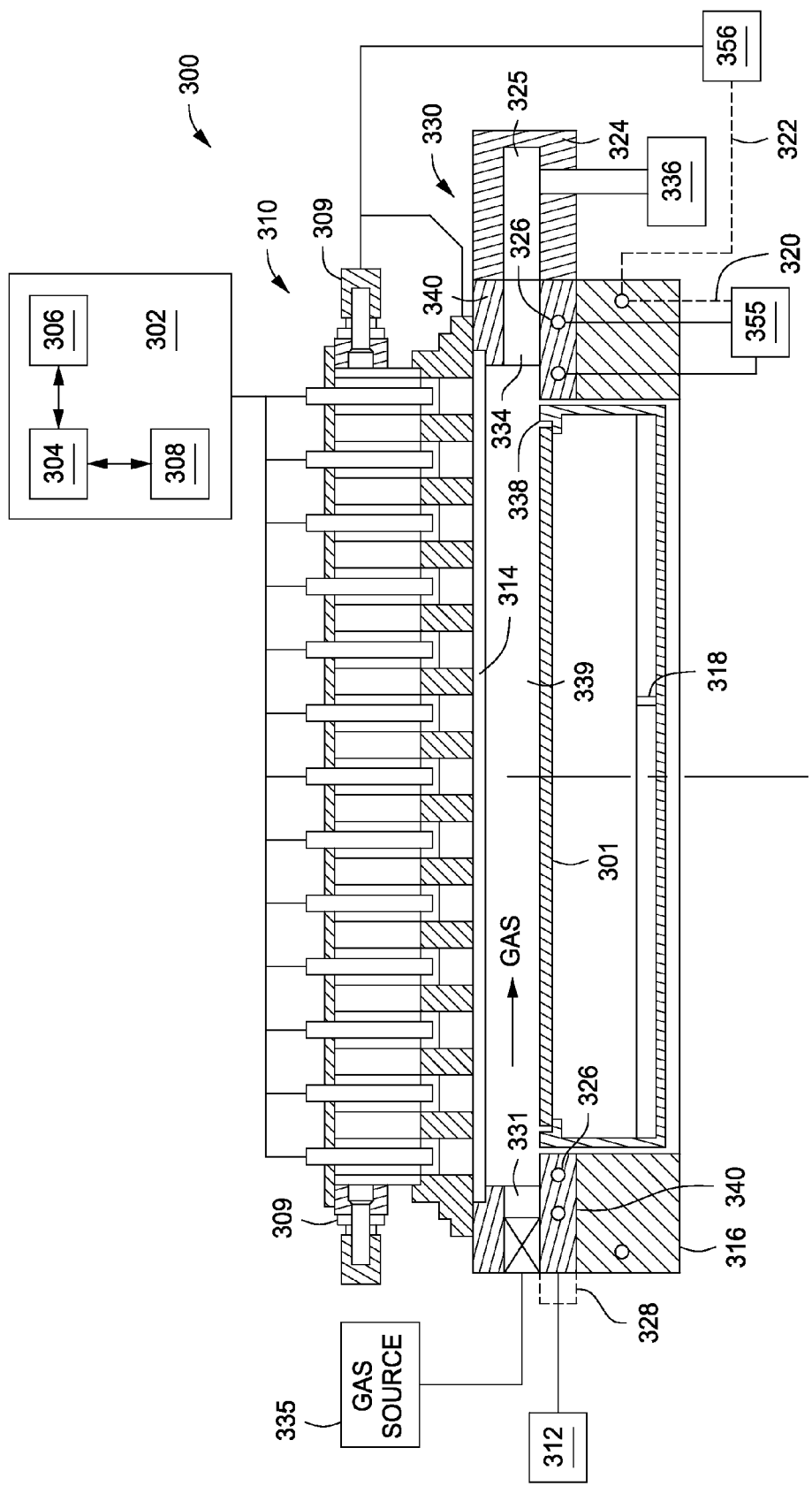
FIG. 3 depicts a schematic sectional side view of a thermal reactor suitable for use in accordance with some embodiments of the invention.

FIG. 3 depicts a schematic sectional side view of a thermal reactor for use in accordance with some embodiments of the invention. The thermal processing chamber 300 generally comprises a lamp assembly 310, a chamber assembly 330 defining a processing volume 339, and a substrate support 338 disposed in the processing volume 339.

The lamp assembly 310 (e.g., a first heat source) is positioned above the chamber assembly 330 and is configured to supply heat to the processing volume 339 via a quartz window 314 disposed on the chamber assembly 330. The lamp assembly 310 is configured to house a process heating source, such as a plurality of tungsten-halogen lamps for providing a tailored infrared heating means to a substrate 301 disposed on the substrate support 338. In some embodiments, the plurality of lamps have an energy density of about 30 watts per square centimeter to about 80 watts per square centimeter. One or more pyrometers (one pyrometer 318 shown) may be disposed beneath the substrate 301 and aimed at a backside of the substrate 301 to provide data corresponding to the temperature of the substrate. The data from the one or more pyrometers may be provided to a controller (e.g., 302) to facilitate feedback control over the process heating source and for use in facilitating the methods described herein.

The chamber assembly 330 generally comprises a base ring 340 having one or more chamber walls defining the processing volume 339 with the quartz window 314 and a bottom wall 316. Although the term ring is used herein, the base ring 340 need not be circular and other shapes are contemplated as well. The base ring 340 may have an inlet 331 coupled to a gas source 335 to provide one or more process gases to the processing volume 339 (such as the oxidizing gas, the first gas, and/or the second gas discussed above). An outlet 334, disposed on an opposite side of the base ring 340 from the inlet 331, is coupled to an exhaust assembly 324 which is in fluid communication with a pump system 336. The exhaust assembly 324 defines an exhaust volume 325, which is in fluid communication with the processing volume 339 via the outlet 334. The exhaust volume 325 is designed to allow uniform gas flow distribution across the processing volume 339.

In some embodiments, a heating apparatus may be provided at least partially disposed within or coupled to the chamber walls (e.g., a second heat source). For example, in some embodiments, a first heat exchanger 355 is coupled to the base ring 340 to control the temperature of the chamber walls by circulating a heat exchange fluid through one or more conduits 326 disposed in the base ring 340. In some embodiments, the first heat exchanger 355 is set to at least 60 degrees Celsius. Alternatively or in combination, a heat jacket 328 may be thermally coupled to the base ring 340 to provide heat to the chamber walls, for example, by flowing a heat transfer fluid through the heat jacket 328, by providing heater elements, such as resistive heaters or heat lamps, within the heat jacket 328, or the like.

In some embodiments, a second heat exchanger 356 is coupled to the lamp assembly 310 to allow heat exchange fluid to be circulated to the lamp assembly 310 through an inlet 309 to keep the lamp assembly 310 cool during processing. In some embodiments, the first heat exchanger and the second heat exchanger may be maintained at different temperatures. In some embodiments, the second heat exchanger 356 may also be coupled to the bottom wall 316, as indicated by dashed line 322. Alternatively, in some embodiments, the first heat exchanger 355 may also be coupled to the bottom wall 316, as indicated by dashed line 320.

A thermocouple 312, or other suitable sensor, may be coupled to the base ring 340 to monitor the outer chamber wall temperature and to determine the inner chamber wall temperature. The thermocouple 312 may be part of, or coupled to, a system controller, such as the system controller 302 that may control the operations of the thermal processing chamber 300.

To facilitate control of the thermal processing chamber 300 as described above, a system controller 302 comprises a central processing unit (CPU) 304, a memory 306, and support circuits 308 for the CPU 304 and facilitates control of the components of the thermal processing chamber 300. The system controller 302 may be one of any form of general-purpose computer processor that can be used in an industrial setting for controlling various chambers and sub-processors. The memory 306, or computer-readable medium, of the CPU 304 may be one or more of readily available memory such as random access memory (RAM), read only memory (ROM), floppy disk, hard disk, or any other form of digital storage, local or remote. The support circuits 308 are coupled to the CPU 304 for supporting the processor in a conventional manner. These circuits include cache, power supplies, clock circuits, input/output circuitry and subsystems, and the like. The methods performed in the thermal processing chamber 300, or at least portions thereof, may be stored in the memory 306 as a software routine. The software routine may also be stored and/or executed by a second CPU (not shown) that is remotely located from the hardware being controlled by the CPU 304.

Thus, methods and apparatus for improving selectivity against metals have been provided herein. The inventive methods and apparatus may advantageously provide improve selective oxidation against metals and minimize the transport of contaminants to the substrate via condensation formed in the process chamber.

While the foregoing is directed to embodiments of the present invention, other and further embodiments of the invention may be devised without departing from the basic scope thereof.

The invention claimed is:

1. An apparatus for thermally processing a substrate, comprising:
    a chamber having sidewalls defining a processing volume and having a substrate support disposed within the processing volume;
    a first heat source comprising a plurality of lamps disposed opposite the substrate support to provide thermal energy to a substrate when disposed on the substrate support, wherein an energy density of the plurality of lamps is about 30 watts per square centimeter to about 80 watts per square centimeter; and
    a second heat source coupled to at least one of the sidewalls to provide thermal energy to the sidewalls.

2. The apparatus of claim 1, wherein the second heat source comprises a heat exchange loop having a conduit for flowing a heat exchange medium through the sidewalls or through a body disposed adjacent to the sidewalls.

3. The apparatus of claim 1, wherein the second heat source comprises one or more resistive heaters disposed in or adjacent to the sidewalls.

4. The apparatus of claim 1, further comprising:
    a heat exchange loop having conduits passing adjacent to the lamps to remove heat from components of the apparatus adjacent to the lamps.

5. The apparatus of claim 1, further comprising:
    a heat exchange loop having conduits passing through or adjacent to a lower portion of the chamber disposed beneath the substrate support to control a temperature of the lower portion of the chamber independently of the sidewalls that are coupled to the second heat source.

6. An apparatus for thermally processing a substrate, comprising:
    a chamber having sidewalls defining a processing volume and having a substrate support disposed within the processing volume;
    a first heat source comprising a plurality of lamps disposed opposite the substrate support to provide thermal energy to a substrate when disposed on the substrate support, wherein an energy density of the plurality of lamps is about 30 watts per square centimeter to about 80 watts per square centimeter; and
    a second heat source coupled to at least one of the sidewalls to provide thermal energy to the sidewalls;
    a base ring including the sidewalls and defining the processing volume to be a cylindrical center processing volume;
    a top wall coupled to the base ring to seal the cylindrical center processing volume from an upper end of the base ring; and
    a bottom wall coupled to the base ring to seal the cylindrical center volume from a lower end of the sidewalls of the base ring, wherein the first heat source is disposed above the top wall, and wherein the second heat source is coupled to the base ring.

7. The apparatus of claim 6, further comprising one or more sensors coupled to the base ring to monitor a temperature of the sidewalls.

8. The apparatus of claim 6, wherein the second heat source comprises a heat exchange loop having a conduit for flowing a heat exchange medium through the sidewalls or through a body disposed adjacent to the sidewalls.

9. The apparatus of claim 6, wherein the second heat source comprises one or more resistive heaters disposed in or adjacent to the sidewalls.

10. The apparatus of claim 6, further comprising:
    a heat exchange loop having conduits passing adjacent to the lamps to remove heat from components of the apparatus adjacent to the lamps.

11. The apparatus of claim 6, further comprising:
    a heat exchange loop having conduits passing through or adjacent to a lower portion of the chamber disposed beneath the substrate support to control a temperature of the lower portion of the chamber independently of the sidewalls that are coupled to the second heat source.

* * * * *